(12) United States Patent
Wu et al.

(10) Patent No.: US 9,754,765 B2
(45) Date of Patent: Sep. 5, 2017

(54) ELECTRODES FOR ETCH

(71) Applicant: Applied Materials, Inc., Santa Clara, CA (US)

(72) Inventors: Banqiu Wu, San Jose, CA (US); Saravjeet Singh, Santa Clara, CA (US); Amitabh Sabharwal, San Jose, CA (US); Ajay Kumar, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 890 days.

(21) Appl. No.: 14/042,490

(22) Filed: Sep. 30, 2013

(65) Prior Publication Data

US 2015/0090401 A1    Apr. 2, 2015

(51) Int. Cl.
   *H01J 37/32*   (2006.01)
(52) U.S. Cl.
   CPC .. *H01J 37/32082* (2013.01); *H01J 37/32541* (2013.01); *H01J 37/32568* (2013.01); *H01J 37/32577* (2013.01); *Y10T 156/10* (2015.01)

(58) Field of Classification Search
   CPC .......... H01J 37/32082; H01J 37/32541; H01J 37/32577; H01J 37/32568; Y10T 156/10
   See application file for complete search history.

(56) References Cited

U.S. PATENT DOCUMENTS

| | | | |
|---|---|---|---|
| 9,101,038 B2 | 8/2015 | Singh et al. | |
| 2008/0144251 A1* | 6/2008 | Tao | H01L 21/6833 361/234 |
| 2010/0018648 A1* | 1/2010 | Collins | H01J 37/32082 156/345.24 |
| 2015/0181683 A1 | 6/2015 | Singh et al. | |

* cited by examiner

*Primary Examiner* — Vishal I Patel
(74) *Attorney, Agent, or Firm* — Blakely, Sokoloff, Taylor & Zafman LLP

(57) ABSTRACT

An electrode having a first portion and a second portion is formed over a substrate to couple to a bias RF power. The first portion is configured to compensate for an electric field at the second portion to even out a distribution of an etching strength over a workpiece placed over the electrode.

12 Claims, 11 Drawing Sheets

ELECTRODES FOR ETCH

FIELD

Embodiments of the present invention pertain to the field of electronic device manufacturing, and in particular, to electrodes for etching.

BACKGROUND

Generally, plasma etching refers to a form of plasma processing used to fabricate integrated circuits. It typically involves a high-speed stream of glow discharge (plasma) of an appropriate gas mixture being shot at a wafer placed on a stage. Typically, plasma is produced from the gas mixture using a high frequency electric field. The plasma can contain ions and/or neutral atoms and radicals. Typically, a bias RF electrode is placed on the stage beneath the wafer to couple to a radio frequency ("RF") bias power source and to create an electric field near the wafer to achieve more anisotropic etch profile. Generally, the electric field is created by the bias RF electrode that acts as a cathode, and a chamber wall that acts as an anode.

FIG. 1A shows a top view 100 and FIG. 1B shows a side view 110 of a typical Bias RF electrode 101. The typical Bias RF electrode 101 is a single piece of metal, as shown in FIGS. 1A and 1B. Generally, an electrical field near the wafer in the etching chamber created by the typical Bias RF electrode is not uniform over the wafer. The strength of the bombardment of the ions and/or neutral atoms and radicals for etching is not uniform over the wafer because of the non-uniform electric field created by the typical Bias RF electrode. Variations of the bombardment strength results in the non-uniform etching of the wafer.

Generally, a chip is fabricated using a photomask that provides a pattern for an integrated circuit layer on the chip. The accuracy of this pattern is critical in manufacturing the chip. Critical dimension ("CD") uniformity is an important property of the patterned photomask. The pattern on the photomask is typically created using a plasma etching technique. Etching the photomask in the plasma chamber using the typical Bias RF electrode as a cathode can introduce etch non-uniformity that can severely impact the CD uniformity of the photomask.

SUMMARY

Methods and apparatuses to provide electrodes to increase etching uniformity over a workpiece are described. In an embodiment, an apparatus to etch a workpiece comprises a first electrode layer having a first portion and a second portion over a substrate to couple to a bias RF power. The first portion is configured to compensate for an electric field at the second portion that allows to even out a distribution of an etching strength over the workpiece placed over the electrode.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. The at least one of the first portion and the second portion of the first electrode layer comprises a ring.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. The at least one of the first portion and the second portion of the first electrode layer comprises a section to couple to the bias RF power.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. The at least one of the first portion and the second portion of the first electrode layer comprises an opening.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. An insulating layer is deposited underneath the first electrode layer.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. A first laminate layer is deposited underneath the first electrode layer.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. A first laminate layer is deposited underneath the first electrode layer. A second laminate layer is deposited over the first electrode layer. A second electrode layer is deposited over the second laminate layer.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. The at least one of the first portion and the second portion of the first electrode layer is used to decrease the etching strength of a portion of the workpiece.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. At least one of the first portion and the second portion of the first electrode layer is used to increase the etching strength of a portion of the workpiece.

In an embodiment, an apparatus to etch a workpiece comprises a first electrode layer having a first portion and a second portion over a substrate to couple to a bias RF power. The first portion is configured to compensate for an electric field at the second portion to even out a distribution of an etching strength over the workpiece. The substrate has a plurality of openings to connect portions of the first electrode layer at a plurality of locations to the bias RF power.

In an embodiment, a first electrode layer is deposited over a substrate to couple to a bias RF power. The first portion is configured to compensate for an electric field at the second portion to even out a distribution of an etching strength over the workpiece. At least one of the first portion and the second portion comprises a ring.

In an embodiment, a first electrode layer is deposited over a substrate to couple to a bias RF power. The first portion is configured to compensate for an electric field at the second portion to even out a distribution of an etching strength over the workpiece. The first portion and the second portion are separated by a distance.

In an embodiment, a first electrode layer is deposited over a substrate to couple to a bias RF power. The first electrode layer has a first portion and a second portion. The first portion is configured to compensate for an electric field at the second portion to even out a distribution of an etching strength over the workpiece. At least one of the first portion and the second portion comprises an opening.

In an embodiment, an insulating layer is deposited on a substrate. A first electrode layer is deposited over the insulating layer to couple to a bias RF power. The first electrode layer has a first portion and a second portion. The first portion is configured to compensate for an electric field at the second portion to even out a distribution of an etching strength over the workpiece.

In an embodiment, a first laminate layer is deposited over a substrate. A first electrode layer is deposited on the first laminate layer to couple to a bias RF power. The first electrode layer has a first portion and a second portion. The first portion is configured to compensate for an electric field at the second portion to even out a distribution of an etching strength over the workpiece. A second laminate layer is deposited on the first electrode layer. A second electrode layer is deposited over the second laminate layer.

In an embodiment, a first electrode layer is deposited over a substrate to couple to a bias RF power. The first electrode layer has a first portion and a second portion. The first portion is configured to compensate for an electric field at the second portion to even out a distribution of an etching strength over the workpiece. The first portion and the second portion is cut from a conductive sheet.

In an embodiment, a first electrode layer is deposited over a substrate to couple to a bias RF power. The first electrode layer has a first portion and a second portion. The first portion is configured to compensate for an electric field at the second portion to even out a distribution of an etching strength over the workpiece. A plurality of openings are formed in the substrate to connect portions of the first electrode layer at a plurality of locations to the bias RF power.

In an embodiment, a system to manufacture an electronic device comprises a chamber. An electrode is coupled to the chamber to provide a bias RF power to etch a workpiece. The electrode has a first portion and a second portion. The first portion is configured to compensate for an electric field at the second portion to even out a distribution of an etching strength over the workpiece. A processor is coupled to the electrode to control the bias RF power supplied to the electrode.

In an embodiment, a system to manufacture an electronic device comprises a chamber. An electrode is coupled to the chamber to provide a bias RF power to etch a workpiece. The electrode has a first portion and a second portion. The first portion is configured to compensate for an electric field at the second portion to even out a distribution of an etching strength over the workpiece. The first portion and the second portion of the electrode comprises a ring. A processor is coupled to the electrode to control the bias RF power supplied to the electrode.

In an embodiment, a system to manufacture an electronic device comprises a chamber. An electrode is coupled to the chamber to provide a bias RF power to etch a workpiece. The electrode has a first portion and a second portion. The first portion is configured to compensate for an electric field at the second portion to even out a distribution of an etching strength over the workpiece. The first portion and the second portion are separated by a distance. A processor is coupled to the electrode to control the bias RF power supplied to the electrode. The processor is configured to adjust at least one of a frequency, a phase, and the RF power supplied to the portions.

In an embodiment, a system to manufacture an electronic device comprises a chamber. An electrode is coupled to the chamber to provide a bias RF power to etch a workpiece. The electrode has a first portion and a second portion. The first portion is configured to compensate for an electric field at the second portion to even out a distribution of an etching strength over the workpiece. At least one of the first portion and the second portion comprises an opening. A processor is coupled to the electrode to control the bias RF power supplied to the electrode.

In an embodiment, a system to manufacture an electronic device comprises a chamber. An electrode is coupled to the chamber to provide a bias RF power to etch a workpiece. The electrode has a first portion and a second portion. The first portion is configured to compensate for an electric field at the second portion to even out a distribution of an etching strength over the workpiece. At least one of the first portion and the second portion of the electrode is used to increase the etching strength of a portion of the workpiece.

In an embodiment, a system to manufacture an electronic device comprises a chamber. An electrode is coupled to the chamber to provide a bias RF power to etch a workpiece. The electrode has a first portion and a second portion. The first portion is configured to compensate for an electric field at the second portion to even out a distribution of an etching strength over the workpiece. At least one of the first portion and the second portion of the electrode is used to decrease the etching strength of a portion of the workpiece.

Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

Figure 1A:
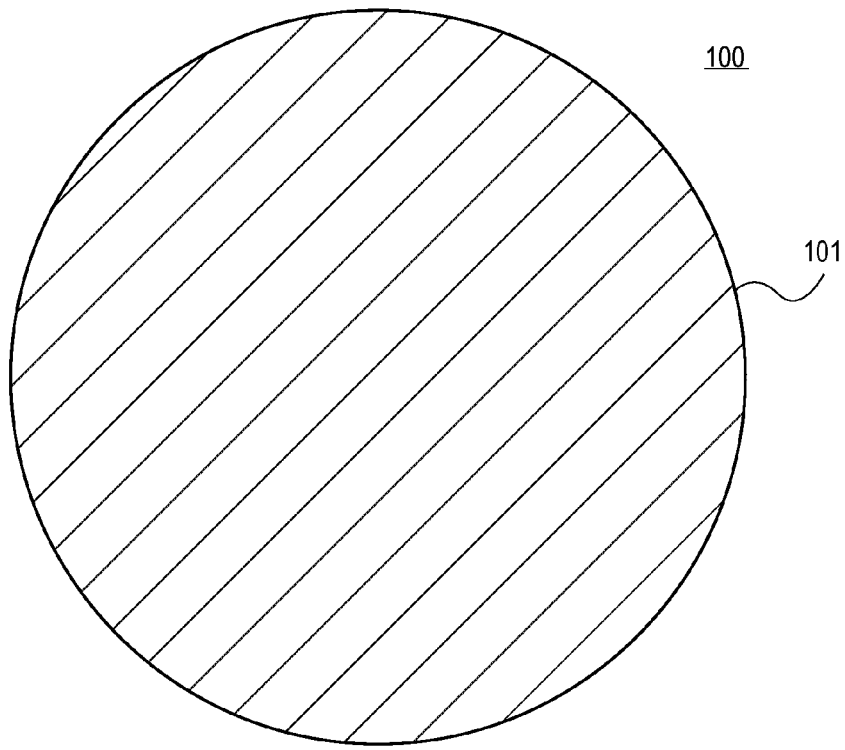
FIG. 1A shows a top view of a typical Bias RF electrode.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to provide electrodes to increase etching uniformity over a workpiece in a plasma chamber are described. An electrode to etch a workpiece comprises a plurality of portions over a substrate to couple to a bias RF power. At least one of the plurality portions is configured to compensate for at least the other one of the plurality of portions to even out the distribution of the etching strength over the workpiece placed over the electrode. The bombardment strength of the plasma particles, such as ions, neutral atoms, and/or radicals that etch the workpiece typically depends on the electric field created by the bias RF electrode, and other etching conditions, such as pressure, temperature, gas flow, and other etching conditions. The distribution of the etching strength over the workpiece placed over the electrode is evened out by adjusting the electric field using the portions of the electrode, as described in further detail below.

In at least some embodiments, methods and apparatuses described herein provide an advantage by increasing the etch uniformity over a workpiece by at least about 0.5 nm. Current specification for etch uniformity allow less than 2 nm deviation in CD parameter over a workpiece (e.g., a high end photomask). Increasing the etch uniformity by at least about 0.5 nm represents at least 25% improvement over the present state of the art. The CD uniformity of the photomask pattern typically depends on a plasma source and a design of the electrode acting as a cathode in a plasma chamber. In at least some embodiments, a bias RF electrode design comprising a plurality of portions, as described herein provide a benefit of increasing the etch CD uniformity in a radial axis, in a side-to-side axis, and in any other direction n over a workpiece by at least 25% over the present state of the art.

Figure 2A:
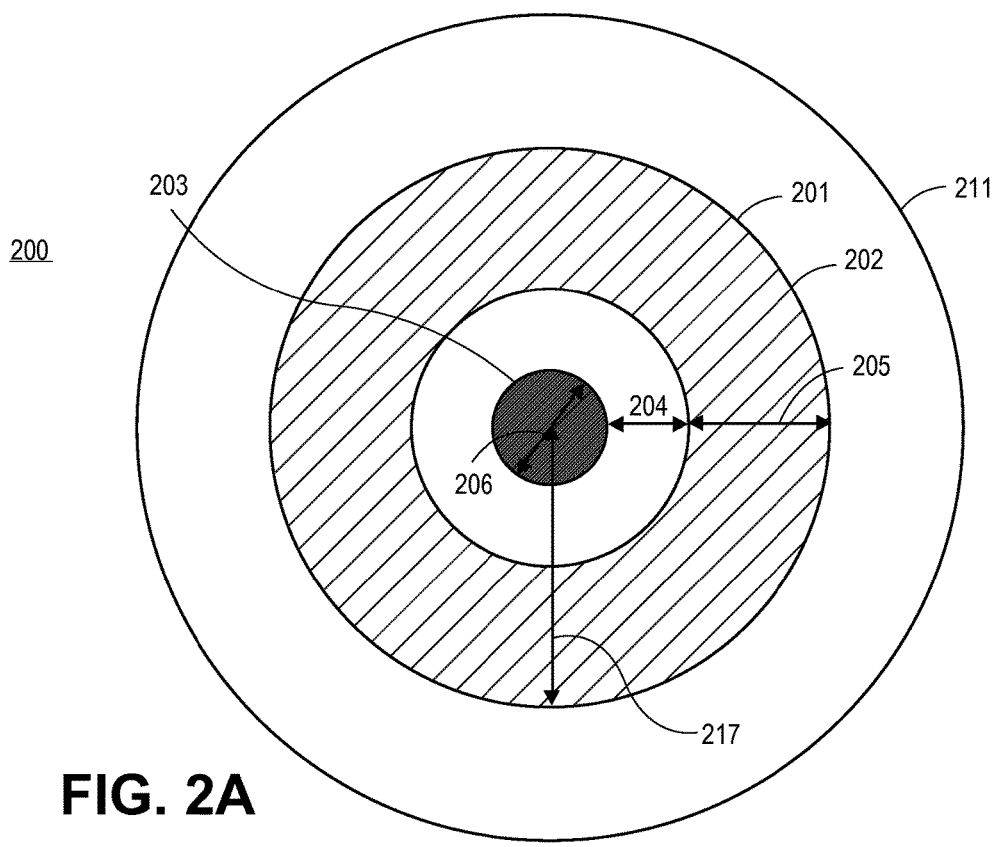
FIG. 2A is a top view of an electrode for etching according to one embodiment.
Figure 2B:
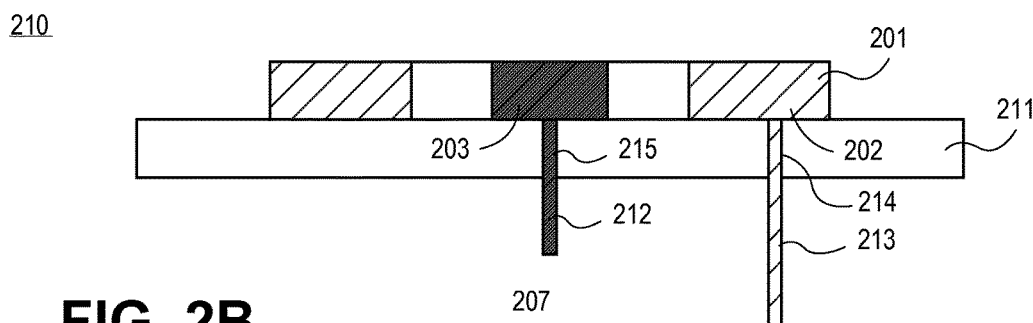
FIG. 2B is a side view of the electrode for etching depicted in FIG. 2A.

FIG. 2A is a top view 200 of an electrode for etching according to one embodiment. FIG. 2B is a side view 210 of the electrode for etching depicted in FIG. 2A. An electrode layer 201 is deposited over a substrate 211 to couple to a bias RF power. As shown in FIGS. 2A and 2B, the electrode layer 201 has a ring portion 202 and a center portion 203 separated by a distance 204. In an embodiment, substrate 211 comprises an insulating layer deposited on a conductive substrate.

In an embodiment, each of the center portion 203 and ring portion 201 can have a circular, elliptical, rectangular, square, or any other shape depending on etching conditions.

In one embodiment, substrate 211 is a conductive substrate. In an embodiment, substrate 211 is an aluminum substrate. In an embodiment, substrate 211 is a copper substrate. In an embodiment, substrate 211 is a conventional single piece of metal Bias RF electrode. In an embodiment, using the conventional single piece of metal Bias RF electrode as a substrate to manufacture a bias RF electrode having a plurality of portions thereon reduces the manufacturing costs.

In one embodiment, substrate 211 comprises a conductive material, for example aluminum (Al), copper (Cu), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), any combination thereof, or any other conductive material known to one of ordinary skill in the art of electronic device manufacturing. In one embodiment, substrate 211 comprises a ceramic bulk material. In an embodiment, the thickness of the substrate 211 is from about 5 millimeters to about 20 millimeters. In an embodiment, the substrate 211 comprises an electrically insulating layer e.g., silicon dioxide. In one embodiment, the electrically insulating layer includes polyimide, epoxy, photodefinable materials, such as benzocyclobutene (BCB), and WPR-series materials, or glass. In one embodiment, the electrically insulating layer is a low permittivity (low-k) ILD layer. In an embodiment the electrode layer 201 is covered by an electrically insulating laminate layer. In an embodiment the electrode layer 201 is placed between two electrically insulating laminate layers. Each of the electrically insulating laminate layers can be a polymer, polyimide, or any combination thereof, or other electrically insulating layer known to one of ordinary skill in the art of electronic device manufacturing.

As shown in FIG. 2B, the substrate 211 has an opening 215 through which a bias RF power 212 is supplied to center portion 203 and an opening 214 through which a bias RF power 213 is supplied to ring portion 202 of the electrode layer 201.

Figure 2C:
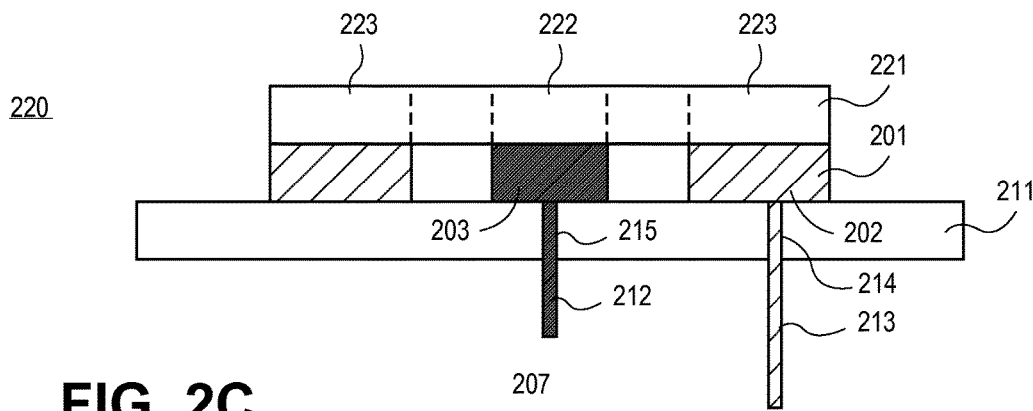
FIG. 2C is a view similar to FIG. 2B after a workpiece is placed over electrode according to one embodiment.

FIG. 2C is a view 220 similar to FIG. 2B after a workpiece 221 is placed over electrode layer 201 according to one embodiment. The workpiece can be a photomask, a semiconductor wafer, or other workpiece known to one of ordinary skill in the art of electronic device manufacturing. In at least some embodiments, the workpiece comprises any material to make any of integrated circuits, passive (e.g., capacitors, inductors) and active (e.g., transistors, photo detectors, lasers, diodes) microelectronic devices. The workpiece may include insulating (e.g., dielectric) materials that separate such active and passive microelectronic devices from a conducting layer or layers that are formed on top of them. In one embodiment, the workpiece is a semiconductor substrate that includes one or more dielectric layers e.g., silicon dioxide, silicon nitride, sapphire, and other dielectric materials. In one embodiment, the workpiece is a wafer stack including one or more layers. The one or more layers of the workpiece can include conducting, semiconducting, insulating, or any combination thereof layers.

Figure 2D:
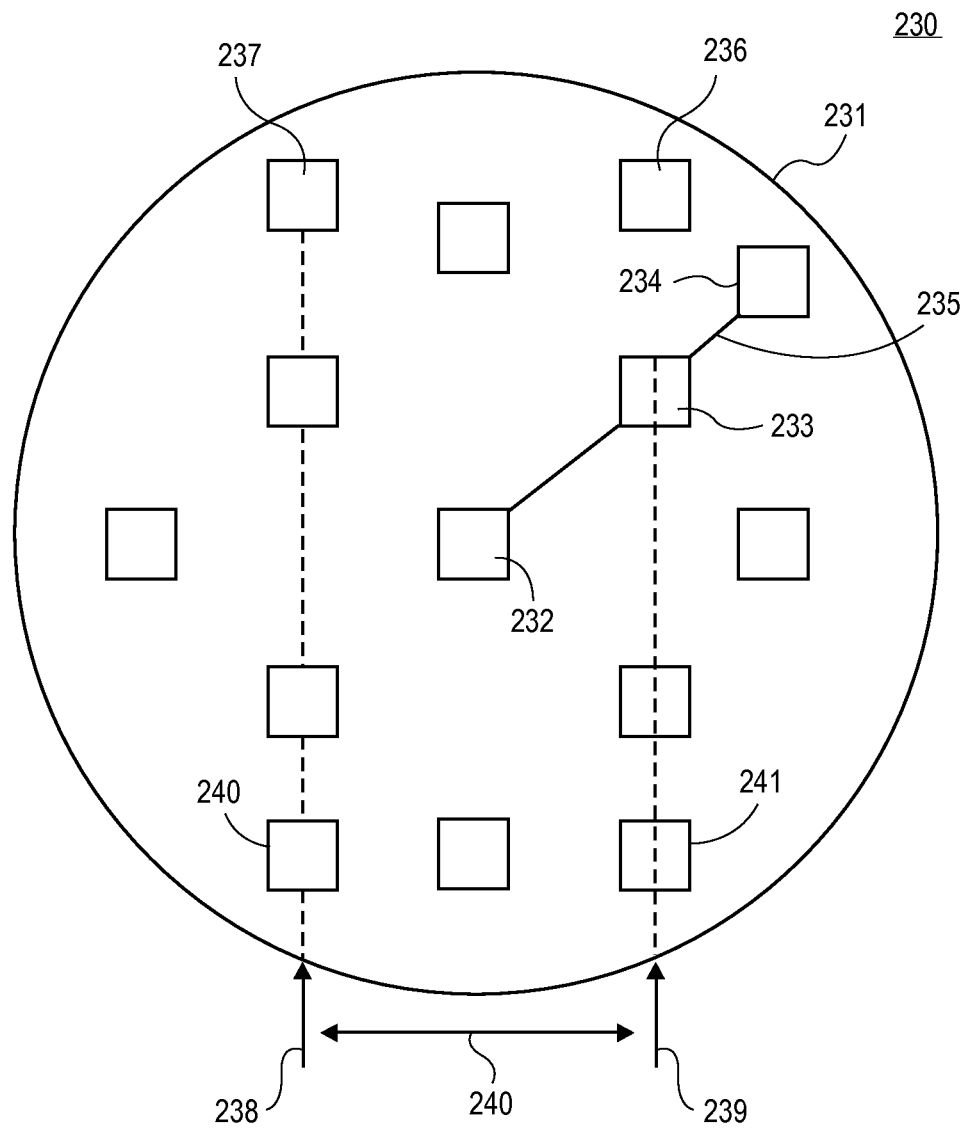
FIG. 2D is a top view of a workpiece according to one embodiment.

FIG. 2D is a top view of a workpiece 231 according to one embodiment. Generally, the etching uniformity is determined by the size of features (e.g., lines or other features representing elements of an integrated circuit) generated by etching over workpiece 231. In an embodiment, if the size of features at different locations of the workpiece, such as features 232, 233, 234, 236, 237, 240, and 241 is similar, the etching is considered uniform over wafer 231. For example, if the size of feature 232 at a center location of the workpiece is similar to the size of features 233 and 234 at locations towards an edge of the wafer, the etching is considered uniform along a radial axis 235. If the size of features 237 and 240 at a side 238 is similar to the size of features 236 and 241 at a side 239, the etching is considered uniform along a side-to-side axis 240. In an embodiment, the etching using the bias RF electrode comprising plurality of portions as described herein allows to even out the distribution of the etching strength over the workpiece, so that a difference between sizes of the features generated by etching at different locations of the workpiece is less than about 2 nm.

In more specific embodiment, a difference between sizes of the features at different locations of the workpiece generated by etching using the bias RF electrode comprising plurality of portions as described herein is less than about 1.5 nm.

Referring back to FIGS. 2B and 2C, in an embodiment, portions 203 and 202 of the electrode are configured to even out an etch strength distribution along a radial axis (e.g., from the center to an edge) over the workpiece 223. In an embodiment, portions 203 and 202 of the electrode are configured to even out an etch strength distribution along a side-to-side axis (e.g., from one edge to another edge) over the workpiece 223.

In an embodiment, a center portion 203 is used to adjust the etching strength at a center portion 222 of the workpiece 221, and a ring portion 202 is used to adjust the etching strength at an edge portion 223 of the workpiece, so that the etching strength at the edge portion 223 and center portion 222 is substantially the same. In an example, a center portion 203 is used to increase the etching strength of center portion 222 of the workpiece 221, and a ring portion 202 is used to decrease the etching strength at edge portion 223 of the workpiece, so that the etching strength at the edge portion 223 and center portion 222 is substantially the same. In another example, a center portion 203 is used to decrease the etching strength of center portion 222 of the workpiece 221, and a ring portion 202 is used to increase the etching strength at edge portion 223 of the workpiece, so that the etching strength at the edge portion 223 and center portion 222 is substantially the same. In an embodiment, the portions (e.g., center portion 203 and ring portion 202) of the Bias RF electrode are used to adjust the uniformity of the etching strength over the workpiece dynamically, on the fly. For example, the uniformity of the etching strength over the workpiece can be adjusted by dynamically adjusting the bias RF power separately supplied to each of the portions of the bias RF electrode, as described in further detail below. In another embodiment, the portions (e.g., center portion 203 and ring portion 202) of the Bias RF electrode are used to adjust the uniformity of the etching strength over the workpiece at the initial of an etching process. For example, the size, shape or both of the portions of the RF bias electrode can be determined such that the etching non-uniformity over the workpiece is compensated at the initial of an etching process, as described in further detail below. Increasing the etch uniformity by using the portions of the bias RF electrode as described herein advantageously improves the critical dimension ("CD") uniformity over a workpiece (e.g., a photomask, a semiconductor wafer, or any other workpiece).

In an embodiment, a width 205 of the ring portion 202, distance 204, and a diameter 206 of the center portion 203 are chosen to even out the distribution of the etching strength over the workpiece 221 placed over the electrode layer 201, so that the etching strength over the workpiece is substantially the same. In a non-limiting exemplary embodiment, each of the width 205, distance 204, and width 205 is about ⅓ of a radius 217 of electrode layer 201.

As shown in FIGS. 2B and 2C, center portion 203 is electrically coupled to a bias RF power 212, and ring portion 202 is electrically coupled to a bias RF power 213. In an embodiment bias power 212 supplied to center portion 203 and bias power 213 supplied to ring portion 202 are controlled separately. In an embodiment, the bias RF power 212 supplied to the center portion 206 and bias RF power 213 supplied to ring portion 202 are adjusted to even out distribution of the etching strength over the workpiece 221 placed over the electrode layer 201, so that the etching strength over the entire workpiece 221 is substantially the same. The etching strength typically is determined by the bombardment strength of the plasma particles, such as ions, neutral atoms, and/or radicals that etch the workpiece. The bombardment strength of the plasma particles is typically determined by the electric field created by the bias RF electrode, and etching conditions, such as a pressure, temperature, gas flow speed, content of the processing gas, and other etching conditions. In an embodiment, the distribution of the etching strength over the workpiece 221 placed over the electrode is evened out by adjusting the electric field created by using the portions of the electrode, such as portions 202 and 203.

Figure 1B:
FIG. 1B shows a side view of a typical Bias RF electrode.
Figure 5A:
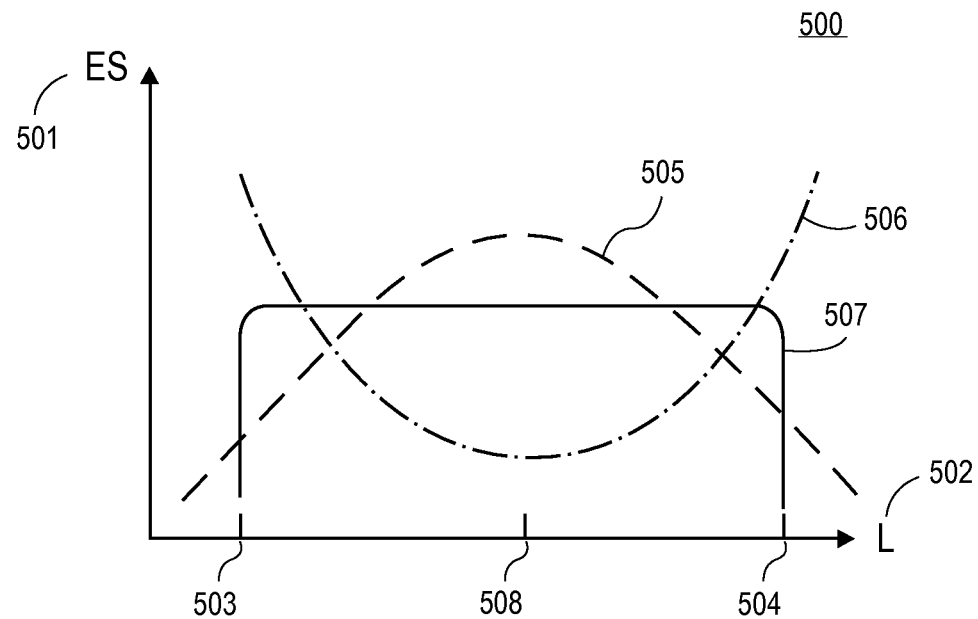
FIG. 5A shows a graph illustrating a distribution of an electric field strength (ES) over a bias RF electrode in a direction L according to one embodiment.

FIG. 5A shows a graph 500 illustrating a distribution of an electric field strength (ES) 501 over a bias RF electrode in a direction L 502 according to one embodiment. The strength of the electric field affects the bombardment strength of the plasma particles to that etch the workpiece. Curves 505 and 506 illustrate a distribution of the ES over a conventional Bias RF electrode, such as electrode 101 depicted in FIGS. 1A and 1B for different etching conditions. Curves 505 and 506 show that the ES over the conventional Bias RF electrode is not uniform. For an etching condition represented by curve 505, the ES is greater at a center 508 than at edges 503 and 504 of the electrode. For an etching condition represented by curve 506 the ES is smaller at center 508 than at edges 503 and 504 of the electrode. Curve 507 illustrates a distribution of the electric field (ES) over a bias RF electrode having a plurality of portions according to one embodiment. The electric field (ES) represented by curve 507 is evened out, so that the electric field is substantially the same over the entire electrode. In an embodiment, the ES is evened out by using the portions of the electrode, as described above. Depending on an embodiment, the direction 512 is a radial axis, a side-to-side axis, or any other direction over the electrode.

Figure 5B:
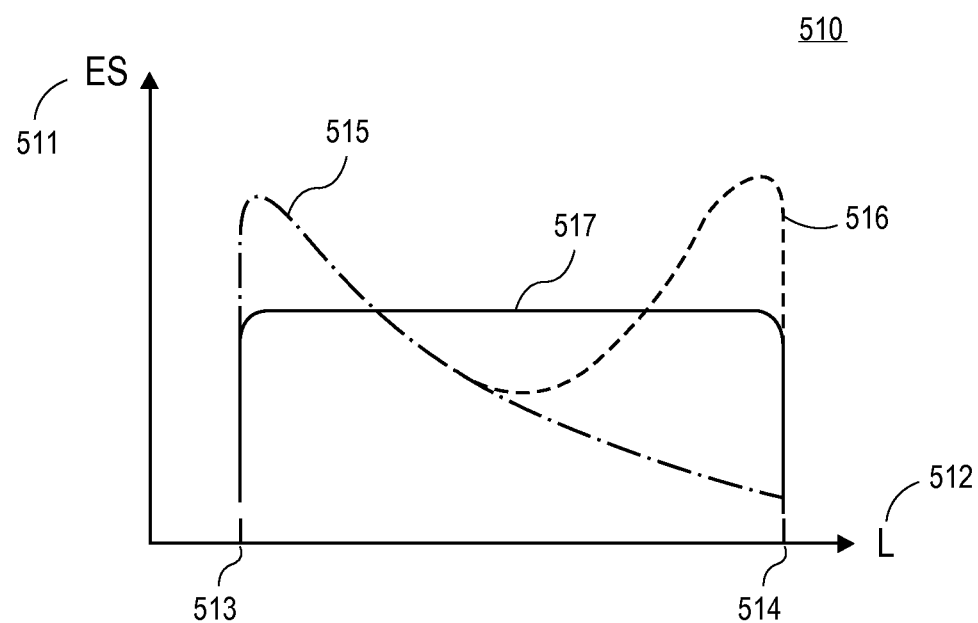
FIG. 5B shows a graph illustrating a distribution of an electric field strength (ES) over a bias RF electrode in a direction L according to one embodiment.

FIG. 5B shows a graph 510 illustrating a distribution of an electric field strength (ES) 511 over a bias RF electrode in a direction L 512 according to one embodiment. Curves 515 and 516 illustrate a distribution of the ES over a conventional Bias RF electrode, such as electrode 101 depicted in FIGS. 1A and 1B for different etching conditions. Curves 515 and 516 show that the ES over the conventional Bias RF electrode is not uniform. For an etching condition represented by curve 515, the ES is greater at an edge 513 than at an edge 514 of the electrode. For an etching condition represented by curve 516 the ES is greater at edge 514 than at edge 513 of the electrode. Curve 517 illustrates a distribution of the ES over a bias RF electrode having a plurality of portions, according to one embodiment. The ES represented by curve 517 is evened out so that the ES over the entire electrode is substantially the same. In an embodiment, the ES is evened out by using the portions of the electrode, as described above. Depending on an embodiment, the direction 512 is a radial axis, a side-to-side axis, or any other direction over the electrode. That is, the plurality of portions of the bias RF electrode compensate for the electric field non-uniformity in a radial, side-to side, or any other direction over the electrode that advantageously increases the etch CD uniformity.

Referring back to FIG. 2C, an amount of bias RF power supplied to each of the portions 203 and 202 to even out the etching strength distribution over the workpiece 221 depends on a distribution of an electric field created by the electrode 201 in a chamber, and etching conditions, for example, a pressure, temperature, gas flow speed, content of the processing gas, and other etching conditions.

In a more specific embodiment, bias RF power 212 can constitute about 30%, and bias RF power 213 can constitute about 70% of the total RF power supplied to the electrode 201. In an embodiment, the bias RF power 212 supplied to the center portion 206 is different from bias RF power 213 supplied to ring portion 202 to even out etching strength so that the etching strength over the entire workpiece is substantially the same. In another non-limiting example, bias RF power 212 can constitute about 70%, and bias RF power 213 constitutes about 30% of the total RF power supplied to the electrode 201. In an embodiment, the bias RF power 212 supplied to the center portion 206 is similar to the bias RF power 213 supplied to ring portion 202 to even out etching strength distribution over the workpiece. In a more specific embodiment, bias RF power 212 can constitute about 50%, and bias RF power 213 constitutes about 50% of the total RF power supplied to the electrode 201.

In an embodiment, bias RF power 212 and bias RF power 213 are supplied to the corresponding portions of the electrode through a power dividing element and corresponding resistor elements from one RF power source. In an embodiment, bias RF power 212 and bias RF power 213 are supplied to the portions of the electrode from different RF power sources to independently adjust the RF power parameters, such as a power value, frequency, phase, and other RF power parameters. In a more specific embodiment, bias RF power 212 is about 20 W, and bias RF power 213 is about 40 W.

In an embodiment, a frequency of Bias RF supplied to each of the center portion 206 and ring portion 202 is adjusted to even out distribution of the etching strength. In a more specific embodiment, the frequency of bias RF 212 can be for example any frequency in an approximate range between about 2 MHz to about 60 MHz, and the frequency of bias RF 213 can be for example any frequency in an approximate range between about 2 MHz to about 60 MHz.

In an embodiment, a phase of Bias RF supplied to each of the center portion 206 and to ring portion 202 is adjusted to even out distribution of the etching strength. In a more specific embodiment, the phase of bias RF 212 can be for example any phase in an approximate range between about 0° to about 360°, and the phase of bias RF 213 can be for example any phase in an approximate range between about 0° to about 360°.

In an embodiment, the electrode layer 201 comprises a metal. In an embodiment, the material for the electrode is aluminum (Al), copper (Cu), or a combination thereof. In other embodiments, the material for the electrode layer includes aluminum (Al), copper (Cu), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), or any combination thereof. In an embodiment, the thickness of the electrode layer of the electrode 201 is from about 0.1 millimeters ("mm") to about 5 mm.

Figure 3A:
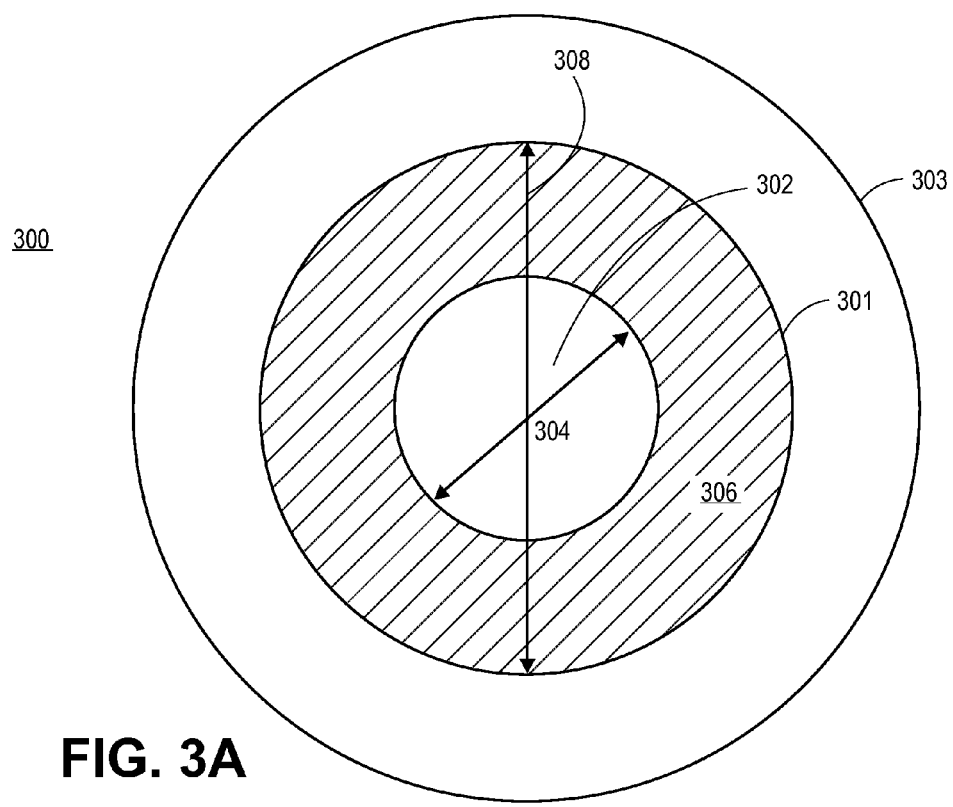
FIG. 3A is a top view of an electrode for etching according to one embodiment.
Figure 3B:
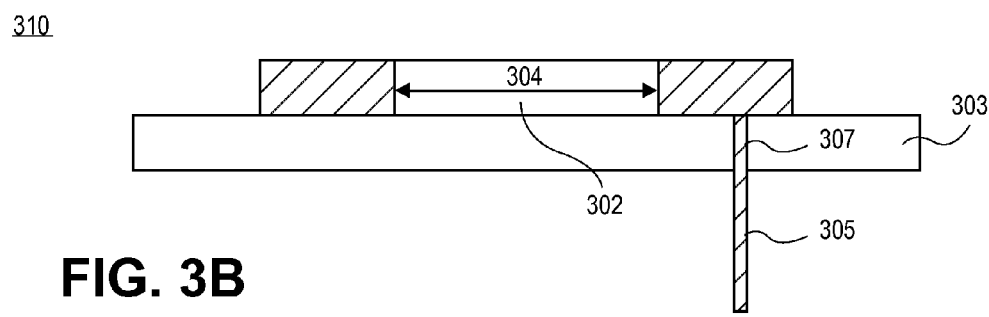
FIG. 3B is a side view of the electrode for etching depicted in FIG. 3A.

FIG. 3A is a top view 300 of an electrode for etching according to one embodiment. FIG. 3B is a side view 310 of the electrode for etching depicted in FIG. 3A. An electrode layer 301 layer is deposited over a substrate 303 to couple to a bias RF power. As shown in FIGS. 3A and 3B, the electrode layer 301 has a ring portion 306 and an opening portion 302. In an embodiment, substrate 303 is similar to the substrate 211 described above. As shown in FIG. 3B, the substrate 303 has an opening 307 through which a bias RF power 305 is supplied to ring portion 306.

Figure 3C:
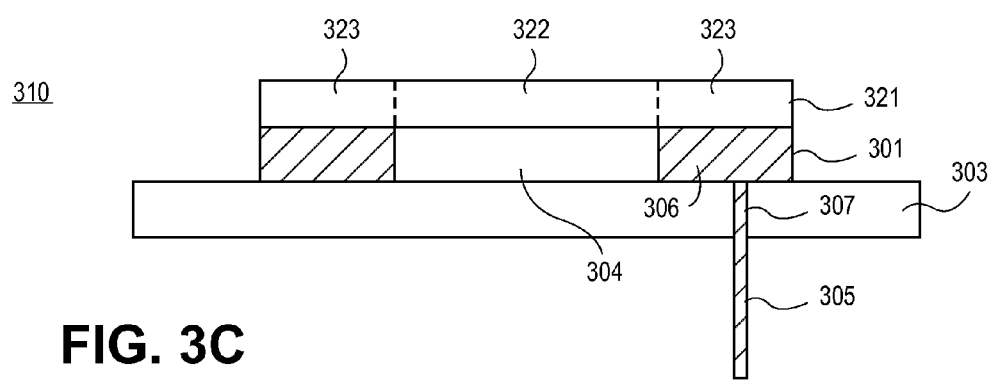
FIG. 3C is a view similar to FIG. 3B after a workpiece is placed over electrode according to one embodiment.

FIG. 3C is a view 320 similar to FIG. 3B after a workpiece 321 is placed over electrode layer 301 according to one embodiment. In an embodiment, portions 302 and 306 of the electrode layer 301 are configured to even out an etch strength distribution along a radial axis (e.g., from the center to an edge) over the workpiece 321. In an embodiment, portions 302 and 306 of the electrode layer 301 are configured to even out an etch strength distribution along a side-to-side axis (e.g., from one edge to another edge) over the workpiece 321. In an embodiment, an opening portion 302 is used to adjust the etching strength at a center portion 322 of the workpiece 221, and a ring portion 306 is used to adjust the etching strength at an edge portion 323 of the workpiece 321. For example, an opening portion 302 is used to decrease the etching strength of center portion 322 of the workpiece 321, and a ring portion 306 is used to increase the etching strength at edge portion 223 of the workpiece.

In an embodiment, a diameter 304 of the opening portion 302 is chosen to even out the distribution of the etching strength over the workpiece 321 placed over the electrode. In an embodiment, diameter 304 is about ½ of a diameter 308 of electrode. As shown in FIGS. 3B and 3C, ring portion 306 is electrically coupled to a bias RF power 305. In an embodiment, the bias RF power 305 supplied to the ring portion 306 is adjusted to even out distribution of the etching strength over the workpiece 321 placed over the electrode. In an embodiment, the distribution of the etching strength over the workpiece 321 placed over the electrode is evened out by reducing the electric field over a central portion 322 caused by removing a portion of the conducting material to create an opening portion 302 that does not provide the electric field, so that the electric field over the central portion 322 is generated only by ring portion 306.

In an embodiment, the distribution of the etching strength over the workpiece 321 placed over the electrode 301 is evened out by reducing the electric field over a portion 322 of the workpiece placed above the opening portion 304. For example, if the bombardment strength over some areas of the workpiece 321, e.g., a portion 322, is much higher than over other portions of the workpiece, the conducting material is removed from the electrode to create openings, such as opening 302 to reduce the strength of the electric field. Reducing the strength of the electric field at opening 302 reduces the etching strength over the corresponding portion, e.g. portion 322 of the workpiece 321. In an embodiment, each of the opening 302 and ring portion 306 can have a circular, elliptical, rectangular, square, or any other shape. In an embodiment, the shape of the opening is determined by the shape of the area of the workpiece that is subjected to higher etching strength than other areas of the workpiece, as described in further detail below.

In an embodiment, the distribution of the electric field caused by the electrode is represented by curve 507 depicted in FIG. 5A. An amount of bias RF power supplied to the portion 306 to even out the etching strength distribution over the workpiece 221 depends on a distribution of an electric field created by the electrode in a chamber, and etching conditions, for example, a pressure, temperature, gas flow speed, content of the processing gas, and other etching conditions. In an embodiment, at least one of a power value, frequency, and phase of the RF power 305 supplied from a RF power source is adjusted. In a more specific embodiment, the value of the bias RF power 212 is from about 10 W to about 100 W. In a more specific embodiment, the frequency of the bias RF power 212 is from about 2 MHz to about 50 MHz. In a more specific embodiment, the phase of the bias RF power 212 is from about 0° to about 360°. In an embodiment, the material of the electrode 301 is similar to the material of the conductive layer of the electrode 201 described above.

Figure 4A:
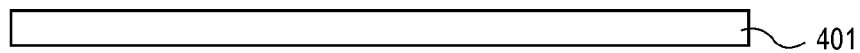
FIG. 4A is a cross-sectional view of a structure to manufacture an electrode for etching according to one embodiment.

FIG. 4A is a cross-sectional view 400 of a structure to manufacture an electrode for etching according to one embodiment. The structure comprises a laminate layer 401. In an embodiment, the laminate layer 401 is an insulating layer comprising a polymer, polyimide, or any combination thereof, or other dielectric layer known to one of ordinary skill in the art of electronic device manufacturing. In an embodiment, the thickness of the laminate layer 401 is from about 0.1 mm to about 0.9 mm. In more specific embodiment, the thickness of the laminate layer 401 is about 0.5 mm.

Figure 4B:
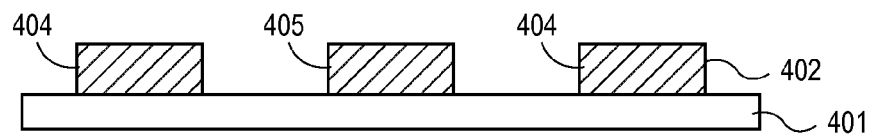
FIG. 4B is a cross-sectional view, similar to FIG. 4A, after an electrode layer having a plurality of portions is deposited on a laminate layer according to one embodiment.

FIG. 4B is a cross-sectional view 410, similar to FIG. 4A, after an electrode layer 402 having a plurality of portions is deposited on the laminate layer 401 according to one embodiment. Electrode layer 402 has a portion 404 and a portion 405 to even out a distribution of an etching strength over the workpiece, as described above. In an embodiment, electrode layer 402 represents an electrode layer 201. In an embodiment, portion 405 represents a center portion 203. In an embodiment, portion 404 represents a ring portion 202. In an embodiment, electrode layer 402 represents an electrode layer 301. In an embodiment, portion 405 represents an opening portion 302. In an embodiment, portion 404 represents a ring portion 306. In other embodiments, electrode layer 402 represents any other electrode layer having a plurality of portions to even out a distribution of an etching strength over the workpiece, as described herein. In an embodiment, the electrode layer 402 is deposited to the thickness from about 0.1 mm to about 5 mm.

In an embodiment, electrode layer 402 is a part of a conductive sheet, and the plurality of portions are fabricated by cutting the conductive sheet, for example, using one of mechanical, etch, laser, or any other cutting techniques known to one of ordinary skill in the art of electronic device manufacturing. In an embodiment, the electrode layer is pressed onto laminating layer 401 using one of the laminating techniques known to one ordinary skill in the art of electronic device manufacturing. In another embodiment, electrode layer is deposited onto laminating layer 401 using an electroplating, sputtering, chemical vapor deposition ("CVD"), atomic layer deposition ("ALD"), or any other deposition technique. In an embodiment, the portions of the electrode layer 402 are fabricated using one of patterning and etching techniques known to one of ordinary skill in the art of electronic device manufacturing.

Figure 4C:
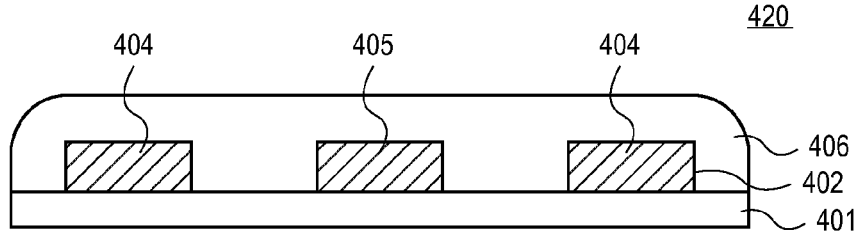
FIG. 4C is a cross-sectional view similar to FIG. 4B after a laminating layer is deposited over the electrode layer according to one embodiment.

FIG. 4C is a cross-sectional view 420 similar to FIG. 4B after a laminating layer 406 is deposited over electrode layer 402 according to one embodiment. As shown in FIG. 4C, laminate layer 406 covers portions 404 and 405. In an embodiment, laminating layer 406 is an insulating layer comprising a polymer, polyimide, or any combination thereof, or other dielectric layer known to one of ordinary skill in the art of electronic device manufacturing. In an embodiment, the thickness of the laminate layer 406 is from about 0.1 mm to about 0.9 mm. In more specific embodiment, the thickness of the laminate layer 401 is about 0.5 mm. In an embodiment, laminate layer 406 is pressed onto electrode layer 402 using one of laminating layer deposition techniques known to one of ordinary skill in the art of electronic device manufacturing. In another embodiment, laminate layer 406 is deposited onto electrode layer 402 using an electroplating, sputtering, chemical vapor deposition ("CVD"), atomic layer deposition ("ALD"), or any other deposition technique.

Figure 4D:
FIG. 4D is a cross-sectional view of a supporting substrate to manufacture an electrode for etching according to one embodiment.

FIG. 4D is a cross-sectional view 430 of a supporting substrate 431 to manufacture an electrode for etching according to one embodiment. In one embodiment, substrate 431 is a conductive substrate. In an embodiment, substrate 431 is an aluminum substrate. In an embodiment, substrate 431 is a copper substrate. In an embodiment, substrate 431 is a conventional single piece of metal Bias RF electrode. In an embodiment, using the conventional single piece of metal Bias RF electrode as a substrate to manufacture a bias RF electrode having a plurality of portions thereon reduces the manufacturing costs.

In an embodiment, substrate 431 comprises a conductive material, for example, aluminum (Al), copper (Cu), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), Vanadium (V), molybdenum (Mo), palladium (Pd), gold (Au), platinum (Pt), any combination thereof, or any other conductive material known to one of ordinary skill in the art of electronic device manufacturing. In one embodiment, substrate 211 comprises a ceramic bulk material. In an embodiment, the thickness of the substrate 431 is from about 5 millimeters to about 20 millimeters.

Figure 4E:
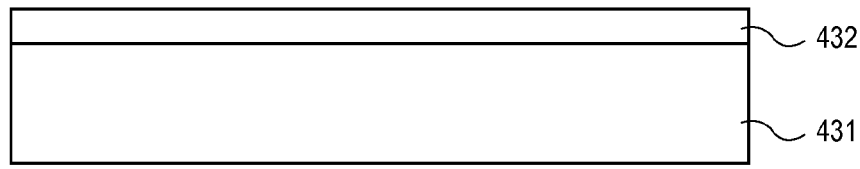
FIG. 4E is a view similar to FIG. 4D after an insulating layer is deposited onto the supporting substrate according to one embodiment.

FIG. 4E is a view 440 similar to FIG. 4D after an insulating layer 432 is deposited onto substrate 431 according to one embodiment. In an embodiment, insulating layer 432 is deposited to the thickness from about 1 mm to about 5 mm. In an embodiment, the electrically insulating layer 432 comprises silicon oxide, silicon nitride, or a combination thereof. In an embodiment, the electrically insulating layer 432 includes polyimide, epoxy, photodefinable materials, such as benzocyclobutene (BCB), and WPR-series materials, or glass. In an embodiment, the electrically insulating layer 432 is a low permittivity (low-k) ILD layer. In an embodiment, electrically insulating layer 432 is deposited on conductive substrate 431 using any of a sputtering technique, chemical vapor deposition ("CVD"), molecular beam epitaxy ("MBE"), an atomic layer deposition ("ALD"), or other deposition technique.

Figure 4F:
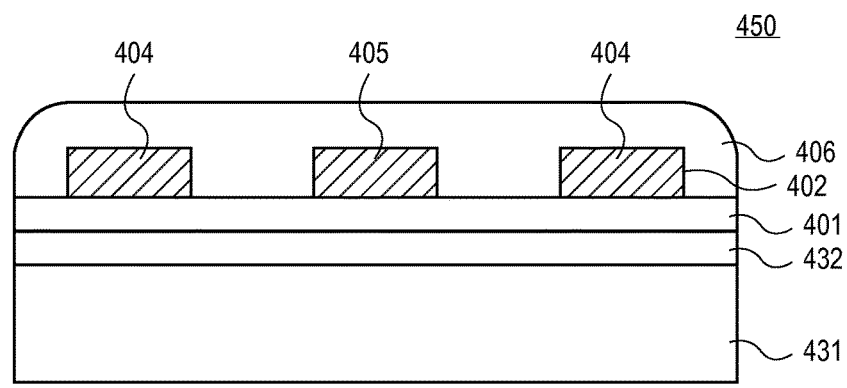
FIG. 4F is a view similar to FIGS. 4C and 4E, after the laminate layer is attached to the insulating layer.

FIG. 4F is a view 450 similar to FIGS. 4C and 4E, after the laminate layer 401 is attached to insulating layer 432. In an embodiment, the laminate layer 401 is attached to insulating layer 432 by applying a pressure using one of laminating techniques known to one of ordinary skill in the art of electronic device manufacturing. In an embodiment, laminate layer 401 is attached to insulating layer 432 by an adhesive using one of adhesive techniques known to one of ordinary skill in the art of electronic device manufacturing.

Figure 4G:
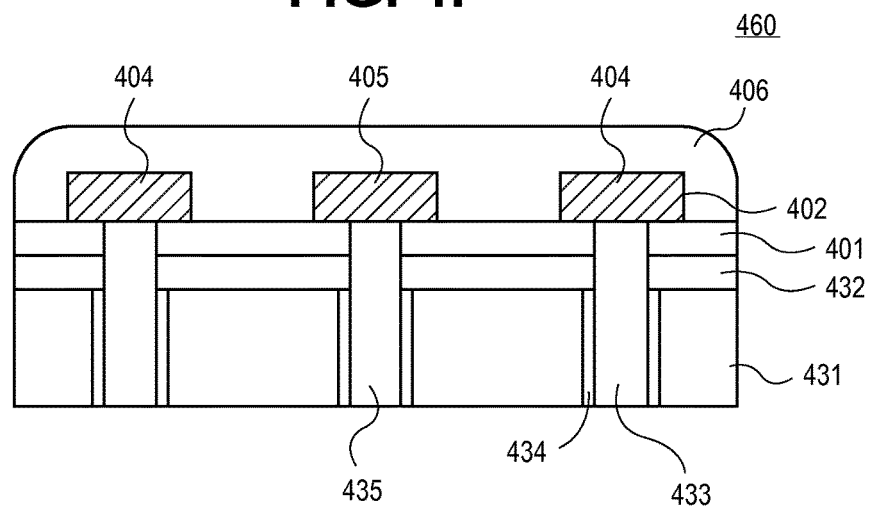
FIG. 4G is a view similar to FIG. 4F after openings are formed to connect portions of the electrode to a bias RF power source.

FIG. 4G is a view 460 similar to FIG. 4F after openings are formed to connect portions to connect portions 404 and 405 to a bias RF power source. As shown in FIG. 4G, an opening 433 and an opening 435 are formed through substrate 431, insulating layer 432 and laminate layer 401 to connect portions 404 and 405 to a bias RF power source. In an embodiment, the openings in the substrate 431 are formed by using one of drilling techniques known to one of ordinary skill in the art of electronic device manufacturing. In an embodiment, the openings in the substrate 431 are formed by using one of etching techniques known to one of ordinary skill in the art of electronic device manufacturing. In an embodiment, the openings in the insulating layer 432 and laminate layer 401 are formed by using one of etching techniques known to one of ordinary skill in the art of electronic device manufacturing. As shown in FIG. 4G, the sidewalls of the openings in a conductive substrate 431 are covered by an electrically insulating layer, such as an insulating liner 434. Insulating liner can be deposited on the sidewalls of the openings in the substrate 431 using a sputtering, chemical vapor deposition ("CVD"), molecular beam epitaxy ("MBE"), atomic layer deposition ("ALD"), or any other deposition technique. In an embodiment, the electrically insulating liner 434 comprises silicon oxide, silicon nitride, or a combination thereof. In an embodiment, the electrically insulating liner 434 includes polyimide, epoxy, photodefinable materials, such as benzocyclobutene (BCB), and WPR-series materials, or glass. In an embodiment, conductive pins (not shown) are inserted through openings 433 and 435 to supply bias RF power to portions 404 and 405.

Figure 4H:
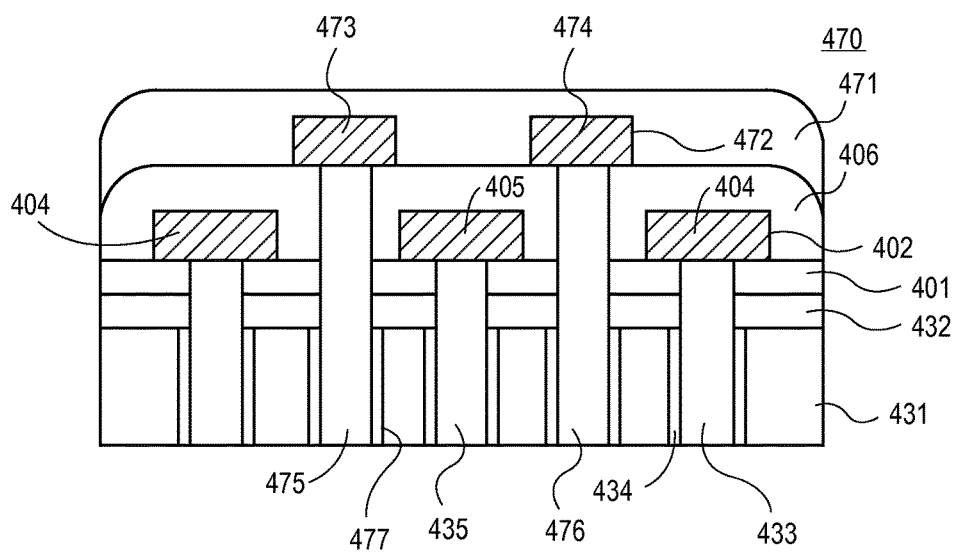
FIG. 4H is a cross-sectional view of a bias RF electrode for etching according to another embodiment.

FIG. 4H is a cross-sectional view 470 of a bias RF electrode for etching according to another embodiment. The bias RF electrode comprises electrode layer 402 having portions 404 and 405 deposited between laminate layer 406 and laminate layer 401 attached to insulating layer 432 on substrate 431, as described above. An electrode layer 472 is deposited on laminate layer 406. Electrode layer 472 has portions 473 and 474. A laminate layer 471 is deposited onto electrode layer 472. Portions 404, 405, 473, and 474 of the bias RF electrode are configured to even out distribution of an etching strength over the workpiece, as described above. In an embodiment, electrode layer 472 is deposited on laminate layer 406 before the laminate layer 401 is attached to insulating layer 432 in operation illustrated in FIG. 4F.

In an embodiment, electrode layer 472 is deposited on laminate layer 406 to the thickness from about 0.1 mm to about 5 mm. In an embodiment, electrode layer 472 is deposited on laminate layer 406 using one of techniques described above with respect to electrode layer 402. In an embodiment, laminate layer 471 is deposited to electrode layer 472 to the thickness from about 0.1 mm about 0.9 mm. In more specific embodiment, the thickness of the laminate layer 471 is about 0.5 mm. In an embodiment, laminate layer 471 is deposited onto electrode layer 472 using one of techniques described above with respect to the laminate layers. Opening 433 and opening 435 are formed through substrate 431, insulating layer 432 and laminate layer 401 to connect portions 404 and 405 to a bias RF power source, as described above. An opening 475 and opening 476 are formed through substrate 431, insulating layer 432 laminate layer 401, laminate layer 406 to connect portions 473 and 474 to a bias RF power source, as shown in FIG. 4H. In an embodiment, openings 475 and 476 are formed through substrate 431, insulating layer 432, laminate layer 401, and laminate layer 406 using one of techniques described above with respect to openings 433 and 435.

As shown in FIG. 4H, the sidewalls of the openings in conductive substrate 431 are covered by an electrically insulating liner, such as an insulating liner 434 and an insulating liner 477 using one of techniques described above with respect to insulating layer 431. In an embodiment, the bias RF electrode comprises one or more electrode layers (not shown) that are deposited over the laminate layer 471 using techniques described above. The electrode layers deposited over the laminate layer 471 are separated from each other by a laminate layer, as described above. Each of the electrode layers deposited over the laminate layer comprises a plurality of portions to even out distribution of etching strength over a workpiece, as described above.

Figure 6A:
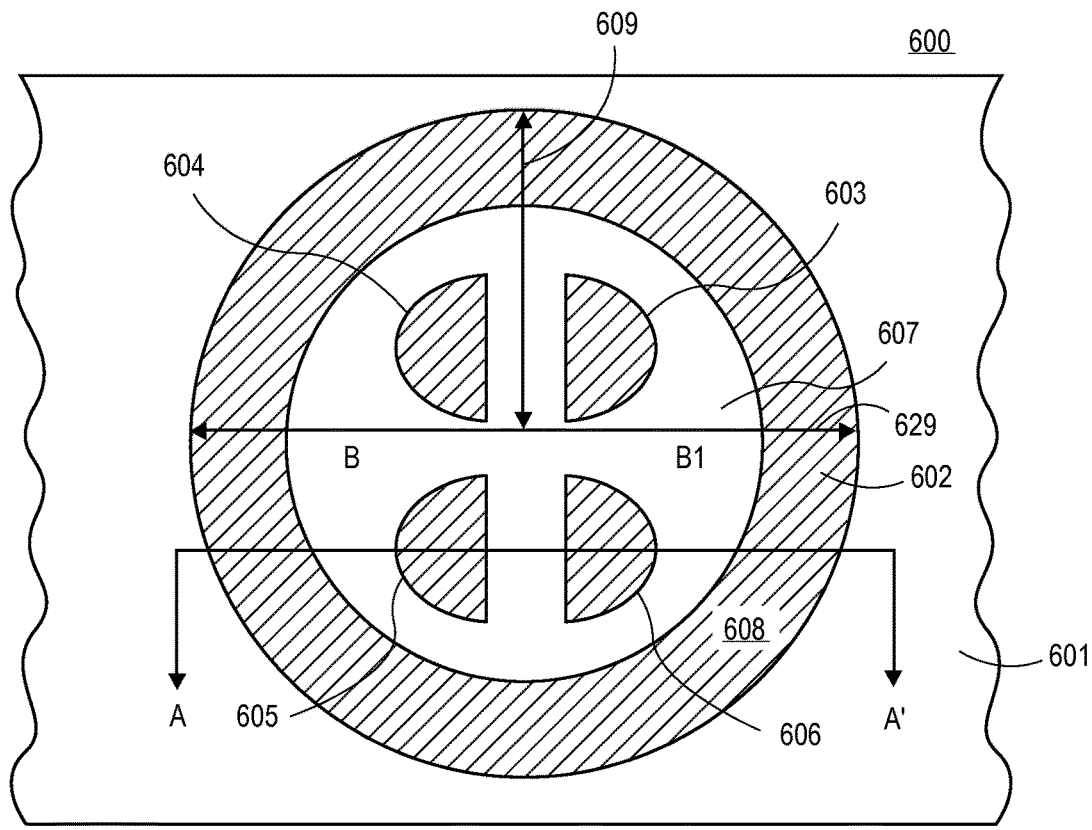
FIG. 6A is a top view of an electrode for etching according to one embodiment.
Figure 6B:
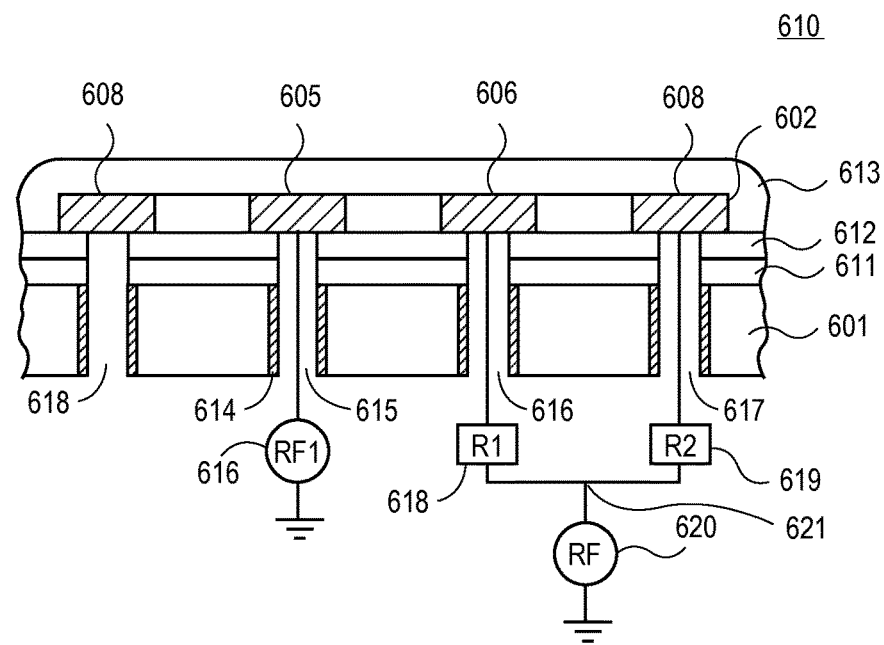
FIG. 6B is a cross-sectional view along axis A-A1 of the electrode for etching depicted in FIG. 6A.

FIG. 6A is a top view 600 of an electrode for etching according to one embodiment. FIG. 6B is a cross-sectional view 610 along axis A-A1 of the electrode for etching depicted in FIG. 6A. An electrode layer 602 is deposited over a substrate 601 to couple to a bias RF power. As shown in FIGS. 6A and 6B, the electrode layer 602 has a ring portion 608, sections 603, 604, 605, and 606, an opening portion 607. In an embodiment, substrate 601 is similar to one of the substrates described above. As shown in FIG. 6B, a laminate layer 613 is deposited on electrode layer 602 on a laminate layer 612, on an insulating layer 611 on substrate 601, as described above. In an embodiment, each of the sections can have a circular, elliptical, rectangular, square, or any other shape. In an embodiment, the shape of each of the sections is determined by the etching conditions.

As shown in FIG. 6B, openings 615, 616, 617, and 618 are formed through substrate 601, insulating layer 611, and laminate layer 612 to supply bias RF power to the portions of the electrode 602, as described above. The sidewalls of the openings are covered by an insulating liner, such as an insulating liner 614, as described above. As shown in FIG. 6B, a bias RF power from a RF source 616 is supplied through opening 615 to section 605, a bias RF power is supplied from a RF source 620 through a power divider, a resistor element 618, and opening 616 to section 606, and a bias RF power is supplied from RF source 620 through a power divider 621, a resistor element 619, and opening 617 to ring portion 608. The resistor element 618 is used to adjust the bias RF power value supplied to the section 606, and the resistor element 619 is used to adjust the bias RF power value supplied to portion 608.

In an embodiment, sections 603, 604, 605, and 606, opening portion 607, and a ring portion 608 of the electrode 602 are configured to even out an electrical field distribution both from a center of the electrode to an edge of the electrode (e.g., along a radial axis 609), and from one edge (side) to another edge (side) of the electrode (e.g., along a side-to-side axis 629) to increase etch uniformity of a workpiece. In an embodiment, sections 603, 604, 605, and 606 of the electrode 602 are used to adjust an electrical field distribution along a side-to-side axis 629. For example, the etching strength along the workpiece in side-to-side axis 629 can be evened out by independently adjusting the bias RF power supplied to each of the sections 603, 604, 605, and 606. In an embodiment, bias RF powers are supplied to the sections 603, 604, 605, 606, and ring portion 608 of the electrode 602 from different RF power sources to independently adjust the bias RF power parameters, such as a power value, frequency, phase, and other bias RF power parameters.

In an embodiment, if the etching strength at side B is greater than the etching strength at side B1, the bias RF power supplied to sections 604, 605, or both is reduced. In an embodiment, if the etching strength at side B1 is greater than the etching strength at side B, the bias RF power supplied to sections 603, 606, or both is reduced. In an embodiment, if the etching strength at side B is greater than the etching strength at side B1, the bias RF power supplied to sections 606, 603, or both is increased. In an embodiment, if the etching strength at side B1 is greater than the etching strength at side B, the bias RF power supplied to sections 603, 606, or both is reduced. In an embodiment, a ring portion 608 and opening portion 607 are used to adjust an electrical field distribution in a radial axis 609, as described above. For example, the etching strength along the workpiece in radial axis 609 can be evened out by decreasing the electrical field using opening portion 607, and increasing the electrical field using ring portion 608.

Figure 7:
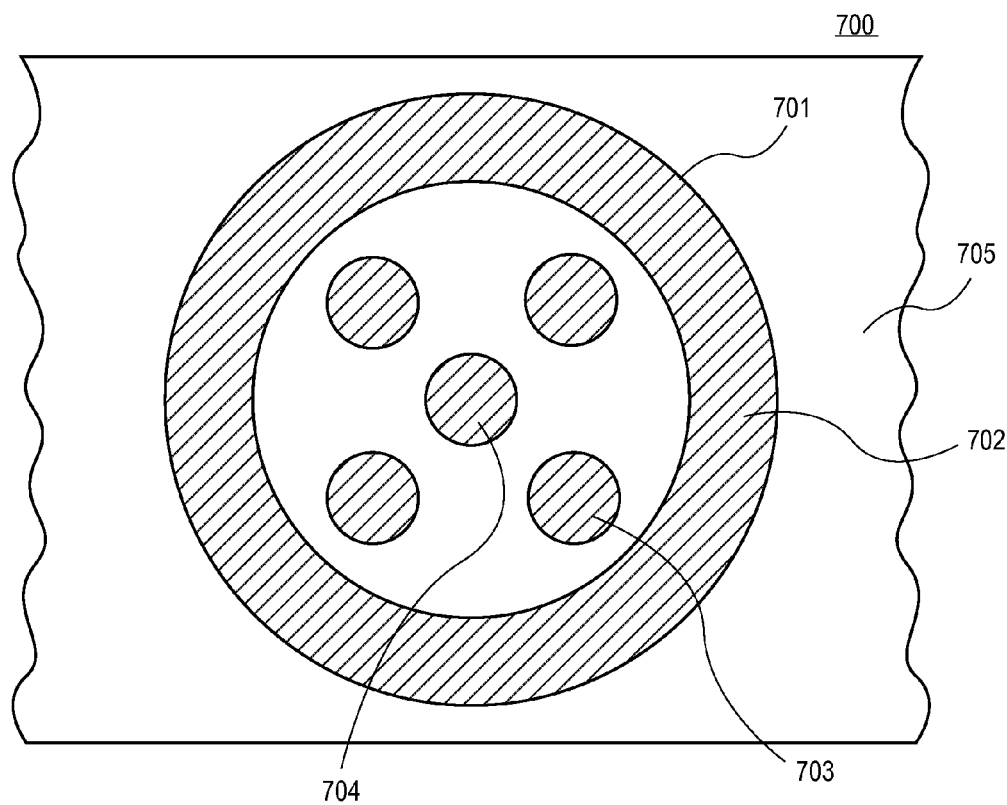
FIG. 7 is a top view of an electrode for etching according to one embodiment.

FIG. 7 is a top view 700 of an electrode for etching according to one embodiment. An electrode layer 701 is deposited over a substrate 705 to couple to a bias RF power, as described above. As shown in FIG. 7 the electrode layer 701 has a ring portion 702, and a plurality of sections, such as a section 703 and a section 704. In an embodiment, substrate 705 is similar to one of the substrates described above. In an embodiment, a laminate layer (not shown) is deposited on electrode layer 701. In an embodiment, electrode layer 701 is deposited on a laminate layer (not shown) attached to an insulating layer (not shown) on substrate 705, as described above. The sections and ring portion 702 are separated from each other by a distance, as described above. In an embodiment, the bias RF powers supplied to the sections, such as section 703 and 704, and ring portion 702 are independently controlled to even out etching strength distribution over a workpiece, as described above.

Figure 8:
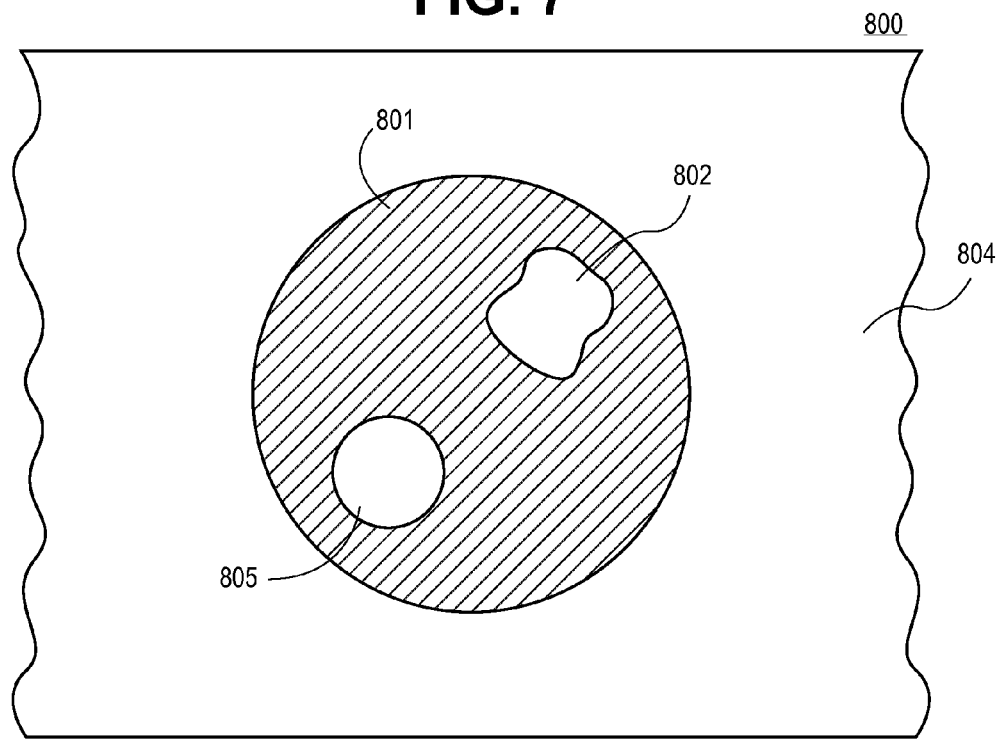
FIG. 8 is a top view of an electrode for etching according to one embodiment.

FIG. 8 is a top view 800 of an electrode for etching according to one embodiment. An electrode 801 is deposited over a substrate 804 to couple to a bias RF power, as described above. As shown in FIG. 8, the electrode 801 has an opening portion 802, and an opening portion 805. In an embodiment, substrate 804 is similar to one of the substrates described above. In an embodiment, a laminate layer (not shown) is deposited on electrode 801. In an embodiment, electrode 801 is deposited on a laminate layer (not shown) attached to an insulating layer (not shown) on substrate 804, as described above. The opening portions 802 and 805 are used to even out the etching strength distribution over a workpiece, as described above.

Figure 9A:
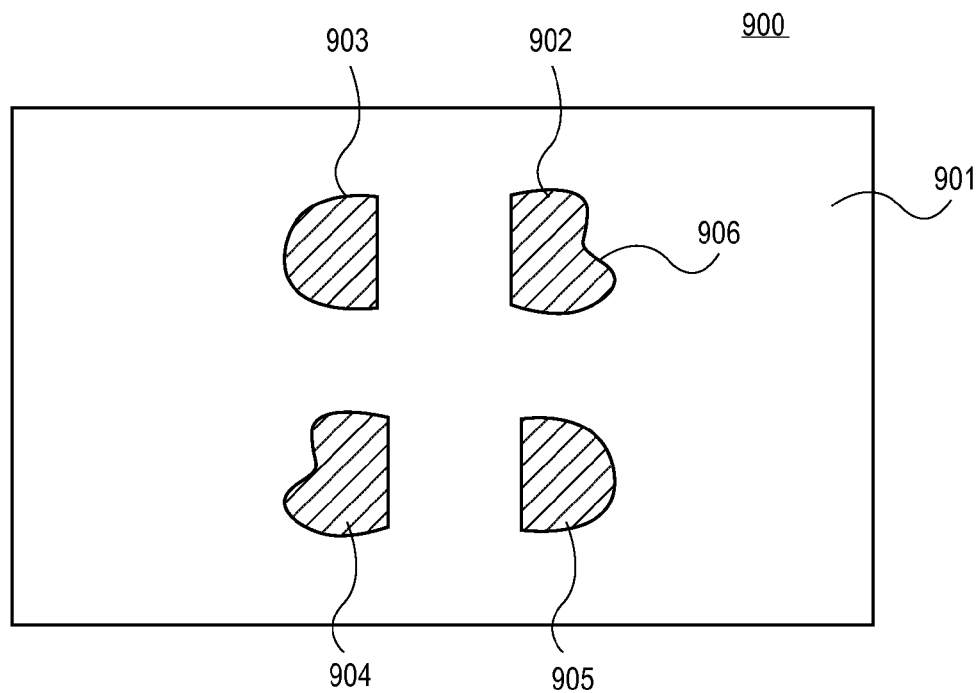
FIG. 9A is a top view of an electrode for etching according to one embodiment.

FIG. 9A is a top view 900 of an electrode for etching according to one embodiment. An electrode 902 comprising sections 903, 904, 905, and 906 is deposited over a substrate 901 to couple to a bias RF power, as described above. In an embodiment, substrate 901 is similar to one of the substrates described above. In an embodiment, a laminate layer (not shown) is deposited on electrode 902. In an embodiment, electrode 902 is deposited on a laminate layer (not shown) attached to an insulating layer (not shown) on substrate 901, as described above. The sections are separated from each other by a distance, as described above. In an embodiment, the bias RF powers supplied to the sections 903, 904, 905, and 906 are independently controlled to even out etching strength distribution over a workpiece in a side-to-side axis, as described above.

Figure 9B:
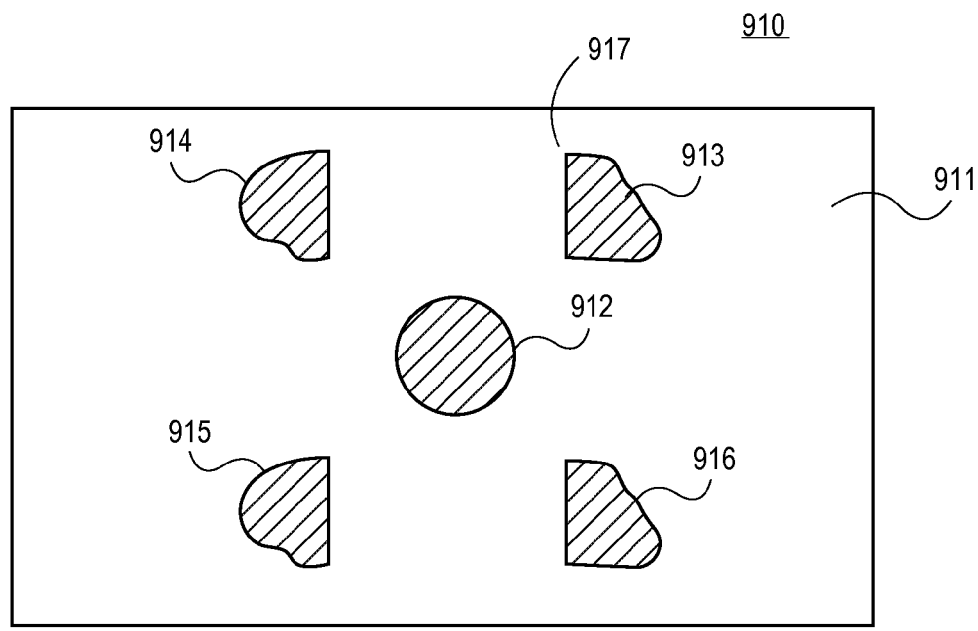
FIG. 9B is a top view of an electrode for etching according to one embodiment.

FIG. 9B is a top view 910 of an electrode for etching according to one embodiment. An electrode 917 comprising a center section 912, and side sections 913, 914, 915, and 916 is deposited over a substrate 911 to couple to a bias RF power, as described above. In an embodiment, substrate 911 is similar to one of the substrates described above. In an embodiment, a laminate layer (not shown) is deposited on the electrode 917. In an embodiment, electrode 917 is deposited on a laminate layer (not shown) attached to an insulating layer (not shown) on substrate 911, as described above. The center section 912, and side sections 913, 914, 915, and 916 are separated from each other by a distance, as described above. In an embodiment, the bias RF powers supplied to the center section 912, and side sections 913, 914, 915, and 916 are independently controlled to even out etching strength distribution over a workpiece, as described above.

Figure 10:
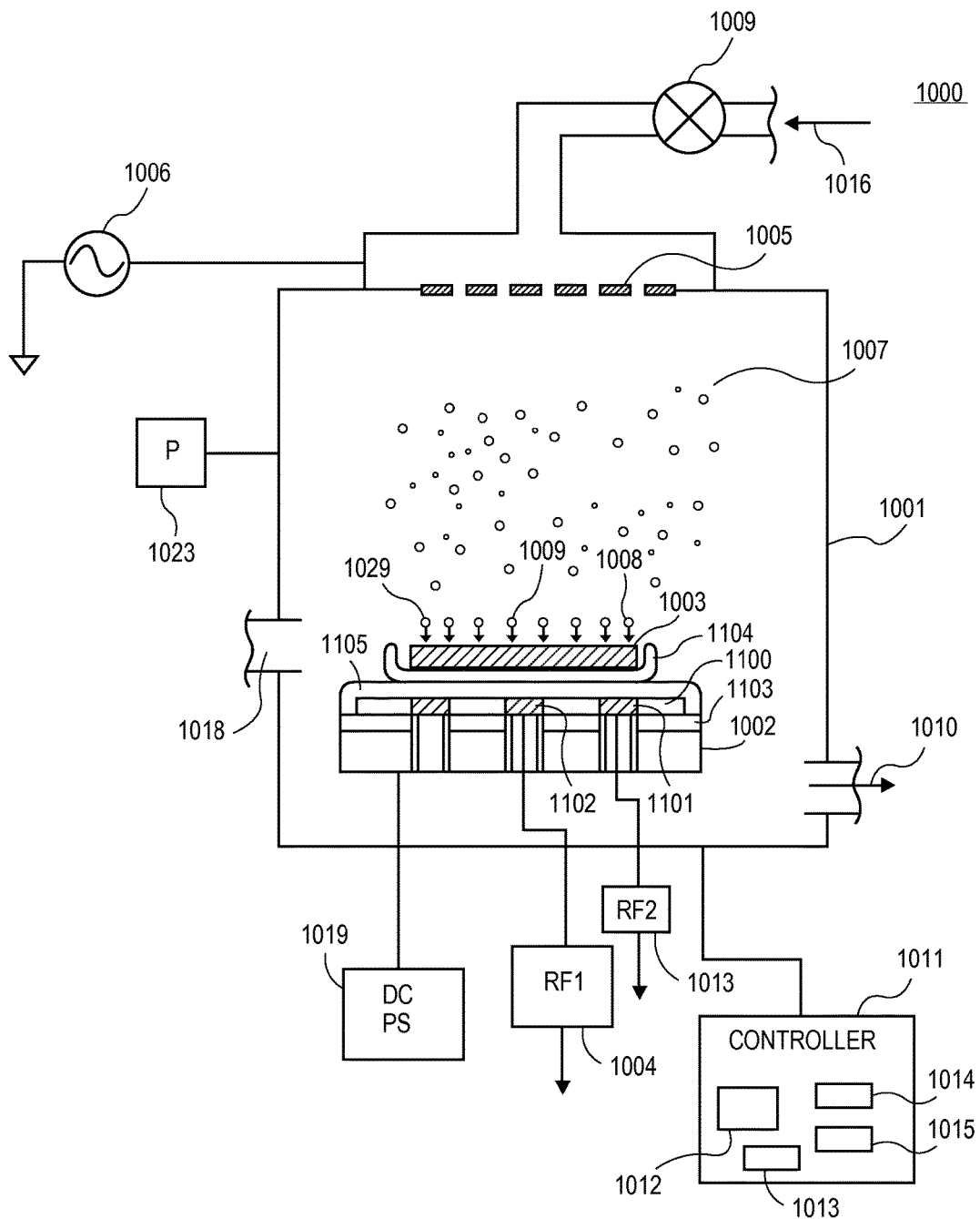
FIG. 10 shows a block diagram of one embodiment of a plasma processing chamber system to increase etching uniformity over a workpiece as described herein.

FIG. 10 shows a block diagram of one embodiment of a processing chamber system 1000 to increase etching uniformity over a workpiece as described herein. As shown in FIG. 10, system 1000 has a processing chamber 1001. A pedestal 1002 is positioned in processing chamber 1001. In an embodiment, pedestal 1002 includes an electrostatic chuck. A supporting substrate 1002 is placed on pedestal. Supporting substrate 1002 represents one of the bias RF electrode supporting substrates described above. In an embodiment, a DC electrode is embedded into the electrostatic chuck. A DC power supply 1019 is connected to the DC electrode.

As shown in FIG. 10, a workpiece 1003 is loaded through an opening 1018 and placed on a holder 1104 over a bias RF electrode 1100. Workpiece 1003 represents one of the workpieces described above. Bias RF electrode 1100 comprising a plurality of portions, such as a portion 1101 and a portion 1102 is deposited on an insulating layer (not shown) on supporting substrate 1103, as described above. The portions of the electrode 1100 are used to even out a distribution of an etching strength over the workpiece 1003, as described above. In an embodiment, bias RF power electrode 1002 is placed between two laminate layers, as described above. Bias RF power electrode 1002 comprising portions 1101 and 1102 represents one of the bias RF power electrodes comprising the plurality of portions described above.

In at least some embodiments, plasma 1007 is produced from one or more process gases 1016 using a high frequency electric field. As shown in FIG. 10, a pressure control system 1023 provides a pressure to processing chamber 1001. As shown in FIG. 10, chamber 1001 is coupled to a RF source power 1006, and to two Bias RF power sources 1004 and 1013 to produce plasma 1007. In an embodiment, at least one of Bias RF powers 1004 and 1013 is applied to pedestal 1002 to create directional electric fields near the workpiece 1003. As shown in FIG. 10, system 1000 includes a controller system 1011 coupled to chamber 1001 to control the bias RF power supplied to the electrode to even out distribution of the etching strength over the workpiece, as described herein. Chamber 1001 is evacuated via the exhaust outlet 1010. Exhaust outlet 1010 is connected to a vacuum pump system (not depicted) to evacuate volatile compounds produced during processing in the chamber.

As shown in FIG. 10, process gases 1016 are supplied through a mass flow controller 1009 to the chamber 1001. When a plasma power is applied to the chamber 1001, plasma 1007 is formed in a processing region over workpiece 1003. A plasma bias powers 1004 and 1013 are coupled to the electrode 1100 that acts as a cathode to energize the plasma. The plasma bias powers 1004 and 1013 are adjusted to even out a distribution of electric field generated by electrode 1100, so that the bombardment strength of the plasma particles over the workpiece 1003 is substantially the same. As shown in FIG. 10, the bombardment strength of the plasma particles at the edges 1008 and 1029 of the workpiece 1003 is substantially the same as the bombardment strength of the plasma particles at the center 1009 of the workpiece 1003. In an embodiment, a bias RF power applied to the RF electrode 1100 is between about 0 W and about 2000 W. A plasma source power 1006 is coupled through a match (not depicted) to a plasma generating element 1005 (e.g., showerhead) which act as an anodic electrode relative to the electrode 1100 to provide high frequency source power to energize the plasma. The plasma source power 1006 typically has a higher frequency than the plasma bias power, and in a particular embodiment, is in the 60 MHz band. In an embodiment, the plasma source 1006 operates at 0-2000 W. In an embodiment, plasma 1007 is a capacitively coupled plasma ("CCP").

A controller system 1011 is coupled to the chamber 1001. The controller 1011 comprises a processor 1012, a temperature controller 1013 coupled to the processor 1012, a memory 1014 coupled to the processor 1012, and an input/output devices 1015 coupled to the processor 1012. In an embodiment, memory 1014 is configured to store the RF power parameters supplied to the portions of the electrode 1100 to even out a distribution of the etching strength over the workpiece, as described above. The controller system 1011 may be either software or hardware or a combination of both. In an embodiment, controller system 1011 is configured to adjust at least one of a frequency, a phase, and the power supplied to the portions of the electrode 1100. The system 1000 may be any type of high performance semiconductor processing chamber known in the art, such as, but not limited to chambers manufactured by Applied Materials, Inc. located in Santa Clara, Calif. Other commercially available semiconductor chambers may be used to perform the methods as described herein.

In alternative embodiments, the controller system 1011 may be connected (e.g., networked) to other machines in a Local Area Network (LAN), an intranet, an extranet, or the Internet. The controller system 1011 may operate in the capacity of a server or a client machine in a client-server network environment, or as a peer machine in a peer-to-peer (or distributed) network environment.

The controller system 1011 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that controller. Further, while only a single controller is illustrated, the term "controller" shall also be taken to include any collection of data processing systems that individually or jointly execute a set (or multiple sets) of instructions to perform any one or more of the methodologies described herein.

Processor 1012 represents one or more general-purpose processing devices such as a microprocessor, central processing unit, or the like. More particularly, the processor 1012 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1012 may also be one or more special-purpose processing devices such as an application specific integrated circuit (ASIC), a field programmable gate array (FPGA), a digital signal processor (DSP), network processor, or the like. Processor 1012 is configured to execute the processing logic for performing the operations described herein.

The controller system 1011 may further include a network interface device, a video display unit (e.g., a liquid crystal display (LCD), a light emitting diode display (LED), a cathode ray tube (CRT), etc.), and a signal generation device (e.g., a speaker). The input/output devices 1015 may include an alphanumeric input device (e.g., a keyboard), a cursor control device (e.g., a mouse), and other input/output devices.

Memory 1014 may include e.g., read-only memory (ROM), flash memory, dynamic random access memory (DRAM) such as synchronous DRAM (SDRAM) or Rambus DRAM (RDRAM), etc.), a static memory (e.g., flash memory, static random access memory (SRAM), etc.), and a secondary memory (e.g., a data storage device), which communicate with each other via a bus.

The memory 1014 may include a machine-accessible storage medium (or more specifically a computer-readable storage medium) on which is stored one or more sets of instructions (e.g., software) embodying any one or more of the methodologies or functions described herein. The software may also reside, completely or at least partially, within the memory 1014 and/or within the processor 1012 during execution thereof by the controller system 1011. The software may further be transmitted or received over a network via the network interface device.

While the memory 1014 is shown in an exemplary embodiment to be a single block, the term "memory" should be taken to include a single medium or multiple media (e.g., a centralized or distributed database, and/or associated caches and servers) that store the one or more sets of instructions. The term "memory" shall also be taken to include any medium that is capable of storing or encoding a set of instructions for execution by the machine and that cause the machine to perform any one or more of the methodologies described herein. The term "memory" shall accordingly be taken to include, but not be limited to, solid-state memories, and optical and magnetic media.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. An apparatus to etch a workpiece comprising:
   a supporting substrate; and
   a first electrode layer comprising a first portion and a second portion over the supporting substrate to couple to a bias RF power, wherein the first portion is configured to compensate for an electric field at the second portion to even out a distribution of an etching strength over the workpiece;
   a first laminate layer underneath the first electrode layer;
   a second laminate layer over the first electrode layer; and
   a second electrode layer over the second laminate layer.

2. The apparatus of claim 1, wherein the first portion and the second portion are separated by a distance.

3. The apparatus of claim 1, wherein at least one of the first portion and the second portion comprises an opening.

4. The apparatus of claim 1, further comprising an insulating layer underneath the first electrode layer.

5. The apparatus of claim 1, wherein at least one of first portion and the second portion comprises a ring.

6. The apparatus of claim 1, wherein at least one of the first portion and the second portion is used to decrease the etching strength of a portion of the workpiece.

7. The apparatus of claim 1, wherein at least one of the first portion and the second portion is used to increase the etching strength of a portion of the workpiece.

8. A system to manufacture an electronic device, comprising:
   a chamber;
   a first electrode coupled to the chamber to provide a bias RF power to a workpiece, the first electrode having a first portion and a second portion,
   wherein the first portion is configured to compensate for an electric field at the second portion to even out a distribution of an etching strength over the workpiece;
   a first laminate layer underneath the first electrode;
   a second laminate layer over the first electrode;
   a second electrode over the second laminate layer;
   and a processor coupled to control the bias RF power supplied to the electrode.

9. The system of claim 8, wherein at least one of the at least one of the first portion and the second portion comprises a ring.

10. The system of claim 8, wherein the first portion and the second portion are separated by a distance, and wherein the processor is configured to adjust at least one of a frequency, a phase, and the power supplied to the portions.

11. The system of claim 8, wherein at least one of the first portion and the second portion comprises an opening.

12. The system of claim 8, wherein at least one of the first portion and the second portion is used to adjust the etching strength of a portion of the workpiece.

* * * * *